United States Patent
Wentzloff et al.

(10) Patent No.: US 9,641,183 B2
(45) Date of Patent: May 2, 2017

(54) DUAL-LOOP PROGRAMMABLE AND DIVIDERLESS CLOCK GENERATOR FOR ULTRA LOW POWER APPLICATIONS

(71) Applicant: THE REGENTS OF THE UNIVERSITY OF MICHIGAN, Ann Arbor, MI (US)

(72) Inventors: David D. Wentzloff, Ann Arbor, MI (US); Muhammad Faisal, Ann Arbor, MI (US)

(73) Assignee: The Regents Of The University Of Michigan, Ann Arbor, MI (US)

( * ) Notice: Subject to any disclaimer, the term of this patent is extended or adjusted under 35 U.S.C. 154(b) by 0 days.

(21) Appl. No.: 15/031,115

(22) PCT Filed: Oct. 22, 2014

(86) PCT No.: PCT/US2014/061719
§ 371 (c)(1),
(2) Date: Apr. 21, 2016

(87) PCT Pub. No.: WO2015/061414
PCT Pub. Date: Apr. 30, 2015

(65) Prior Publication Data
US 2016/0269035 A1    Sep. 15, 2016

Related U.S. Application Data (60) Provisional application No. 61/894,089, filed on Oct. 22, 2013.

(51) Int. Cl.
*H03L 7/06*    (2006.01)
*H03L 7/087*    (2006.01)
(Continued)

(52) U.S. Cl.
CPC ............ *H03L 7/087* (2013.01); *H03L 7/0991* (2013.01); *H03L 7/0995* (2013.01); *H03L 7/113* (2013.01);
(Continued)

(58) Field of Classification Search
USPC ....... 327/2–12, 105–123, 141–163; 331/1 A, 331/15–17; 375/373–376
See application file for complete search history.

(56) References Cited

U.S. PATENT DOCUMENTS 5,950,115 A    9/1999   Momtaz et al.
6,037,821 A    3/2000   Wodnicki et al.
(Continued)

FOREIGN PATENT DOCUMENTS

JP    2006-191372 A    7/2006

OTHER PUBLICATIONS

International Search Report and Written Opinion for PCT/US2014/061719, mailed Jan. 19, 2015; ISA/KR.

*Primary Examiner* — Brandon S Cole
(74) *Attorney, Agent, or Firm* — Harness, Dickey & Pierce, PLC (57) ABSTRACT

A programmable clock generator is provided which is particularly suitable for low power applications. The programmable clock generator is comprised of: an oscillator circuit that generates an output signal whose frequency is set by a control signal, two feedback loops for controlling output frequency and a loop select that selects which feedback loop is operational at a given time. In operation, the frequency loop operates to coarsely adjust the frequency of the output signal; whereas, the phase loop operates to finely adjust the frequency of the output signal. The clock generator is preferably implemented by transistors operating in or near the subthreshold region.

17 Claims, 8 Drawing Sheets

(51) Int. Cl.
*H03L 7/113* (2006.01)
*H03L 7/23* (2006.01)
*H03L 7/099* (2006.01)
*H03B 5/32* (2006.01)

(52) U.S. Cl.
CPC ............... *H03L 7/235* (2013.01); *H03B 5/32* (2013.01); *H03L 2207/50* (2013.01)

(56) References Cited

U.S. PATENT DOCUMENTS

| | | | |
|---|---|---|---|
| 6,310,521 B1 * | 10/2001 | Dalmia | H03L 7/087 327/156 |
| 6,353,647 B1 * | 3/2002 | Wilhelmsson | H03L 7/093 327/156 |
| 6,683,930 B1 * | 1/2004 | Dalmia | H03D 13/004 375/373 |
| 6,987,406 B1 * | 1/2006 | Chiu | H03K 23/50 327/156 |
| 7,035,369 B2 | 4/2006 | Bourdeau | |
| 7,764,088 B2 * | 7/2010 | Chen | H03L 7/0807 327/12 |
| 7,898,343 B1 * | 3/2011 | Janesch | H03L 7/087 331/11 |
| 7,932,784 B1 | 4/2011 | Janesch et al. | |
| 8,559,582 B2 * | 10/2013 | Hoang | H03L 7/087 375/373 |
| 2002/0075980 A1 | 6/2002 | Tang et al. | |
| 2004/0239431 A1 | 12/2004 | Tan | |
| 2005/0030001 A1 * | 2/2005 | Jasa | H03L 7/087 324/76.53 |
| 2011/0309888 A1 * | 12/2011 | Bulzacchelli | H03L 7/0995 331/109 |
| 2012/0062291 A1 * | 3/2012 | Saitoh | H04L 7/033 327/157 |
| 2012/0218014 A1 * | 8/2012 | Burg | H03L 7/113 327/156 |

* cited by examiner

DUAL-LOOP PROGRAMMABLE AND DIVIDERLESS CLOCK GENERATOR FOR ULTRA LOW POWER APPLICATIONS

CROSS-REFERENCE TO RELATED APPLICATIONS

This application claims the benefit of U.S. Provisional Application No. 61/894,089, filed on Oct. 22, 2013. The entire disclosure of the above application is incorporated herein by reference.

FIELD

The present disclosure relates to a programmable clock generator for ultra low power applications.

BACKGROUND

Significant research efforts are being focused on ultra-low power (ULP), small form factor mobile devices for applications such as health monitoring and the internet of things (IoT). These applications seek to extend battery life and/or achieve energy autonomy through energy harvesting and ULP design. Reducing the supply voltage (VDD) of digital circuits, typically near or below $V_{th}$, is an effective way to save power. An architectural technique to further optimize power consumption is to dynamically scale the supply voltage (DVS) based on workload. However, DVS varies gate delays exponentially below $V_{th}$, requiring dynamic frequency scaling in order to account for performance variations caused by voltage scaling. Therefore, there's a growing need for low-voltage, stable, programmable at run-time ULP clock generators (CKGEN). A number of sub-µW programmable clock generator solutions have already been reported, but they all lack programmability and therefore cannot offer dynamic frequency scaling. Current programmable clock generators are targeted towards high frequency and are too high power for NTC SoCs. A popular solution for clock programmability in microcontrollers is to generate the highest desired frequency with a crystal oscillator and then a divider generates lower frequencies. However, this is not a low-power solution, and cannot achieve the best possible performance as the phase noise degrades proportional to $N^2$, where N is the divider ratio. Finally, IoT applications demand low-cost solutions, which for IC design translates to small form factor, case of integration and test, and minimal off-chip components. For these reasons, all-digital architectures leveraging the digital design flow are highly desirable. In this disclosure, a 187.5 kHz to 500 kHz ADPLL-based clock generators is presented that consumes 300 nW from a 0.5V VDD, has a jitter <0.1% and was implemented in a 0.13 µm process. The entire ADPLL was completely implemented using standard digital design flows and automatic place and route (APR). Moreover, an integrated crystal oscillator (31.25 kHz) is included and serves as the reference frequency for the PLL. Therefore, this is a complete programmable clock generator solution for ULP NTC platforms.

This section provides background information related to the present disclosure which is not necessarily prior art.

SUMMARY

This section provides a general summary of the disclosure, and is not a comprehensive disclosure of its full scope or all of its features.

A programmable clock generator is provided. The programmable clock generator is comprised generally of: an oscillator circuit that generates an output signal whose frequency is set by a control signal, two feedback loops for controlling output frequency and a loop select that selects which feedback loop is operational at a given time. In operation, the frequency loop operates to coarsely adjust the frequency of the output signal; whereas, the phase loop operates to finely adjust the frequency of the output signal.

In one aspect, the frequency-locked loop circuit is configured to receive a desired output frequency and the output signal from the oscillator circuit. The frequency-locked loop circuit determines the frequency of the output signal and generates an error signal without the use of a frequency divider, where the error signal indicates a difference between the desired output frequency and the determined output frequency. In some embodiments, the frequency-locked loop circuit oversamples the output signal from the oscillator circuit using, for example an edge combiner, and determines the frequency of the output signal from the oversampled signal.

Likewise, the phase-locked loop circuit is configured to receive a reference signal and the output signal from the oscillator circuit. The phase-locked loop circuit determines a phase error between the reference signal and the output signal without the use of a frequency divider and generates an error signal from the phase error, where the error signal indicates a difference between the desired output frequency and the determined output frequency. In some embodiments, the phase-locked loop circuit employs a time-to-digital converter circuit to determine phase error, such that the error signal can computed by taking a derivative of the phase error signal.

The loop selector circuit is configured to receive the error signal from the frequency-locked loop circuit and the error signal from the phase-locked loop circuit. For coarse adjustment, the loop selector circuit enables the frequency-locked loop circuit and disables the phase-locked loop circuit when the difference indicated by the error signal received from the phase-locked loop circuit is greater than a threshold. Conversely, for fine adjustment, the loop selector circuit enables the phase-locked loop circuit and disables the frequency-locked loop circuit when the difference indicated by the error signal received from the frequency-locked loop circuit is less than a threshold. The loop selector circuit selects one of the error signals and outputs the selected error signal to a controller. The controller converts the error signal to a control signal for the oscillator circuit.

In some embodiments, the oscillator circuit is implemented by a ring oscillator. The oscillator circuit can also be implemented with CMOS technology, such that each transistor has a channel length approximately ten times the minimum length for CMOS technology.

In another aspect, the programmable clock generator is implemented by transistors operating only in or near sub-threshold region.

Further areas of applicability will become apparent from the description provided herein. The description and specific examples in this summary are intended for purposes of illustration only and are not intended to limit the scope of the present disclosure.

DRAWINGS

The drawings described herein are for illustrative purposes only of selected embodiments and not all possible implementations, and are not intended to limit the scope of the present disclosure.

Corresponding reference numerals indicate corresponding parts throughout the several views of the drawings.

DETAILED DESCRIPTION

Example embodiments will now be described more fully with reference to the accompanying drawings.

Figure 1:
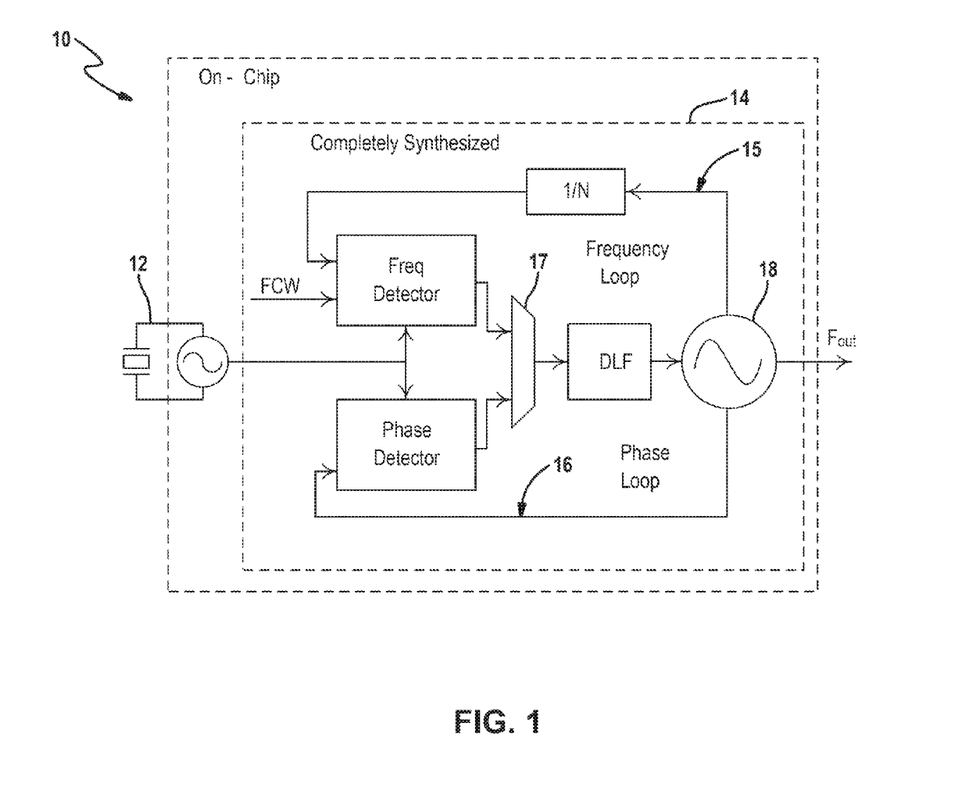
FIG. 1 is a block diagram depicting an overall architecture for a programmable clock generator.

FIG. 1 depicts an overall architecture for a programmable clock generator 10. The programmable clock generator is comprised of an off-chip crystal 12 and an integrated on-chip oscillator 14. The on-chip oscillator 14 employs two mutually exclusive feedback loops: a frequency loop 15 and a phase loop 16. The frequency loop 15 operates to coarsely adjust the frequency of the signal output by the oscillator 14 towards a desired, programmable frequency; whereas, the phase loop 16 operates to finely adjust the frequency of the signal output by the oscillator 14 towards the desired, programmable frequency. A loop selector 17 selects which loop is operational at a given time and a digitally controlled oscillator 18 generates an oscillating output signal in accordance with a control signal received from the selected loop. During operation, the frequency loop 15 is enabled when the frequency error between the desired frequency and the output frequency exceeds a threshold (e.g., four kHz) and the phase loop 16 is enabled when the frequency error between the desired frequency and the output frequency is below the threshold. Because the correct harmonic is found first by the frequency loop, the phase loop can be dividerless to save power.

Figure 2A:
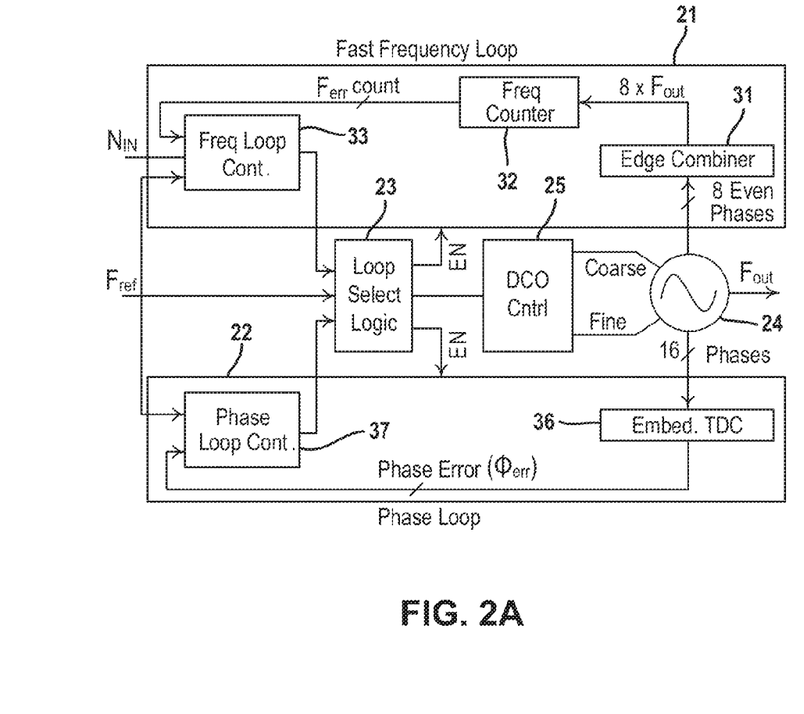
FIG. 2A is a block diagram depicting an example arrangement for the on-chip oscillator.
Figure 2B:
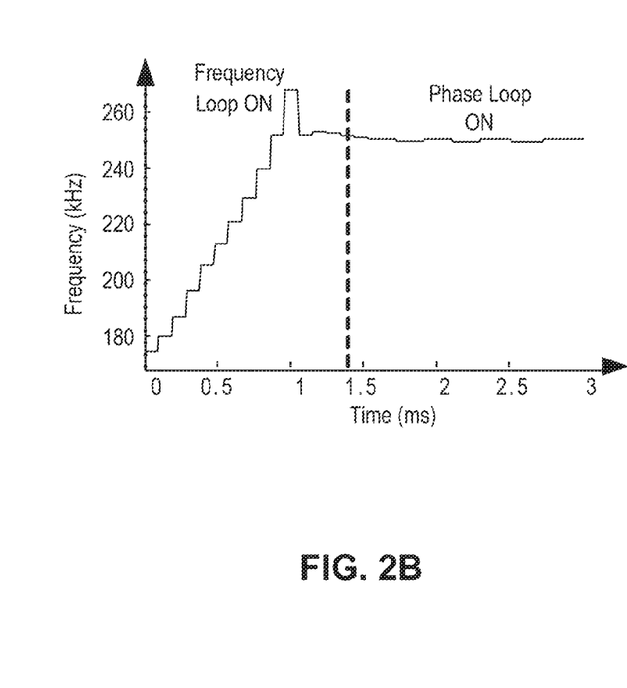
FIG. 2B is a graph illustrating the step response of the programmable clock generator.

An example arrangement for the on-chip oscillator 14 is further described in relation to FIGS. 2A and 2B. The on-chip oscillator 14 is comprised generally of a frequency-locked loop circuit 21, a phase-locked loop circuit 22, a loop selector circuit 23, a digitally controlled oscillator 24 and a controller 25. Each of these components is further described below.

The frequency-locked loop circuit 21 is designed to quickly search for the desired harmonic that the clock generator is trying to generate as seen in FIG. 2B. To do so, the frequency-locked loop circuit 21 is configured to receive an indicator for the desired output frequency, a reference signal from the off-chip crystal and the output signal from the oscillator 24. In this example, the desired output frequency can be computed by multiplying the reference signal $F_{ref}$ with the indicator for the desired output frequency $N_{IN}$ (an integer multiplier). The frequency-locked loop circuit 21 determines the frequency of the output signal, preferably without the use of a frequency divider, and generates an error signal indicative of a difference between the desired output frequency and the output frequency.

In the example arrangement, an edge combiner 31 is used to oversample the output signal from the oscillator 24. The edge combiner 31 combines the edges of the oscillator to generate a frequency that is higher than the desired output frequency. An implementation for the edge combiner 31 is further illustrated in top portion of FIG. 4 although other types of implementations are contemplated by this disclosure. The frequency counter 32 in turn counts the edges of the output of the edge combiner 31 and generates a binary representation of the output frequency. Because counting edges is fast, oversampling occurs. Oversampling in the frequency loop enables quick acquisition of frequency. A frequency loop controller 33 receives the binary representation of the output frequency and determines the magnitude and sign (positive or negative) of the error between the desired output frequency and the output frequency. Lastly, the error signal is fed by the frequency loop controller 33 to the loop selector circuit 23.

The phase-locked loop circuit 22 is also configured to receive the reference signal and the output signal from oscillator 24. The phase-locked loop circuit 22 operates to determine a phase error between the reference signal and the output signal without the use of a frequency divider. In the example arrangement, a time-to-digital converter circuit 36 is used to sample the phases of the output signal and generate a binary representation of the phase difference between the reference signal and the output signal. An implementation for the time-to-digital converter 36 is further illustrated in bottom portion of FIG. 4. A phase loop controller 37 receives the binary representation of the phase difference and generates an error signal, where the error signal indicates a difference between the desired output frequency and the determined output frequency. More specifically, the derivative of the phase error signal (or difference between two phase error values) represents the frequency error and thus can serve as the error signal. The error signal is fed by the phase loop controller 37 to the loop selector circuit 23. Other techniques for computing an error signal from the phase difference are also contemplated by this disclosure.

The loop selector circuit 23 toggles between the two loops, thereby reducing power consumption. For coarse adjustment, the loop selector circuit 23 enables the frequency-locked loop circuit 21 when the difference indicated by the error signal received from the phase-locked loop circuit 22 is greater than a threshold (e.g., 4 kHz). Concurrently, the loop selector circuit 23 disables the phase-locked loop circuit 21. Conversely, for fine adjustment, the loop selector circuit 23 enables the phase-locked loop circuit 22 and disables the frequency-locked loop circuit 21 when the difference indicated by the error signal received from the frequency-locked loop circuit 21 is less than the threshold. Values of the threshold may vary depending on the application. Moreover, the programmable clock generator 10 is implemented by transistors operating exclusively in or near subthreshold region to further reduce power consumption.

Figure 4:
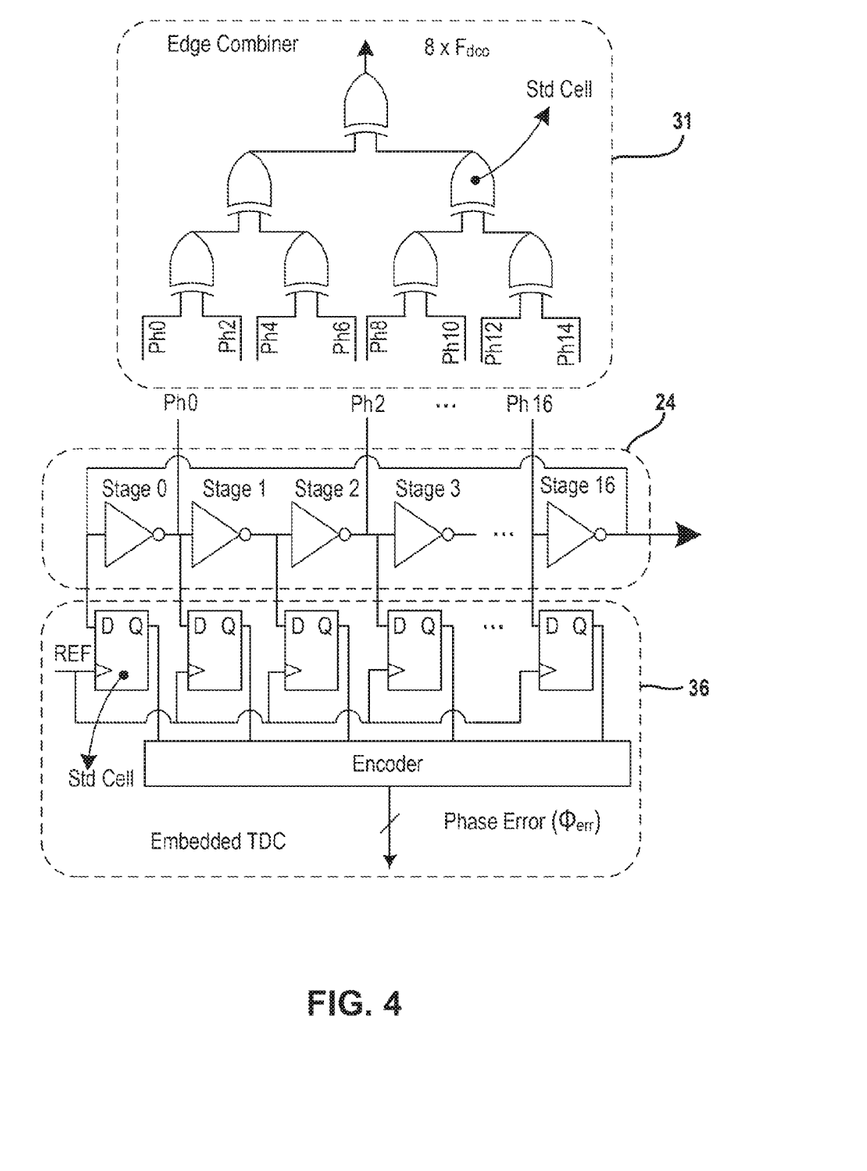
FIG. 4 is a diagram depicting an example embodiment for the digitally controlled oscillator.

FIG. 4 depicts an example embodiment for the digitally controlled oscillator 24. In the example embodiment, the oscillator is a 17 stage single ended ring oscillator. Each stage of the oscillator is comprised of an always-on inverter 51 and a switchable inverter 52 as better seen in FIG. 5. Each stage also has four switch-cap cells 53 which allow fine tuning of the frequency, for example at 1 kHz steps on average. Each cell 33 is further defined as four parallel circuit path with each circuit path having a switch 54 and a capacitor 55 in series with each other. In an example implementation, these unit tri-state inverter and switch cap cells were integrated with the standard cell library using the same pitch as the digital cells. Black box abstracts of these cells were then created so that they can be instantiated, placed, and routed in a digital flow. The rest of the ADPLL only uses standard cells. The entire ADPLL was then described using structural and behavioral Verilog, synthesized, and APR'd using standard digital CAD tools. This design methodology is much faster than full-custom layout, and also reduces the power and area.

Figure 5:
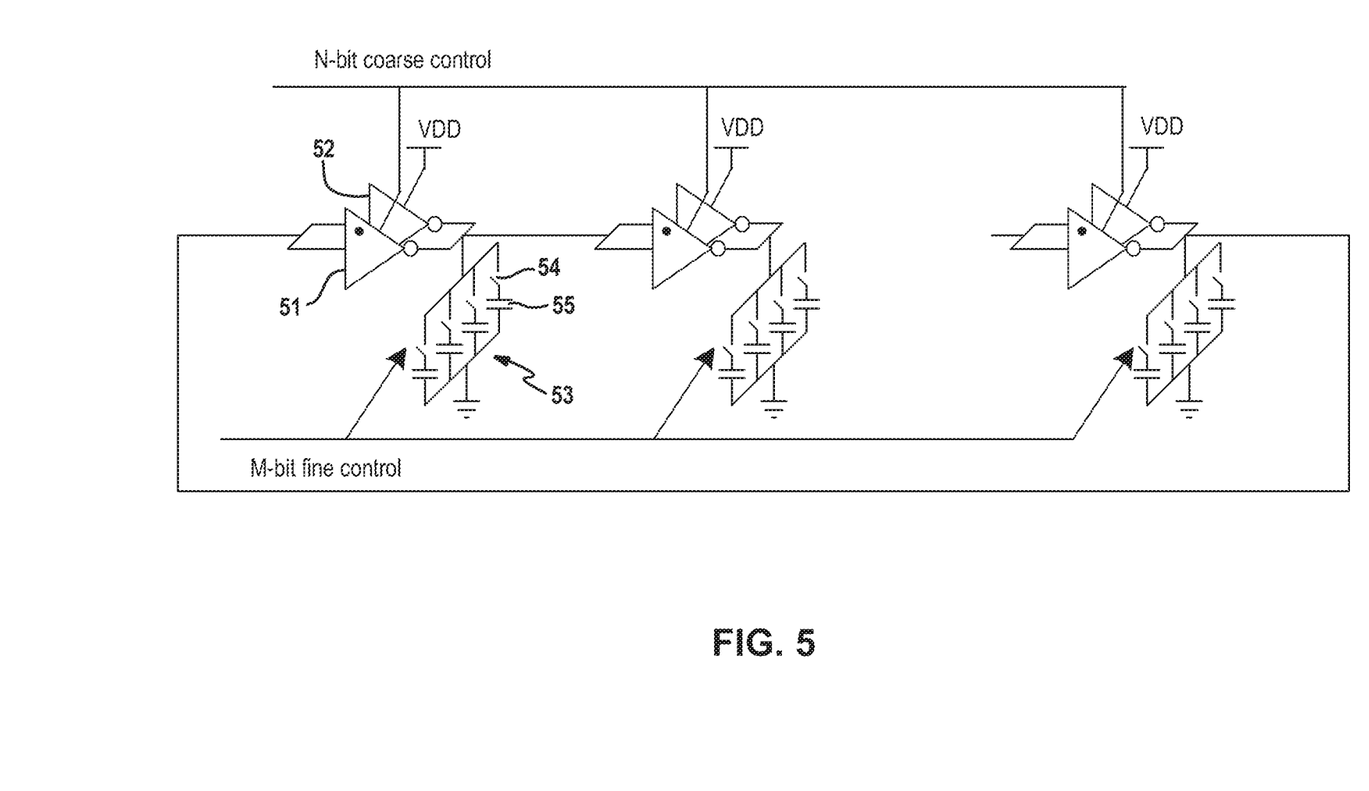
FIG. 5 is a schematic further depicting the example embodiment for the digitally controlled oscillator.
Figure 6A:
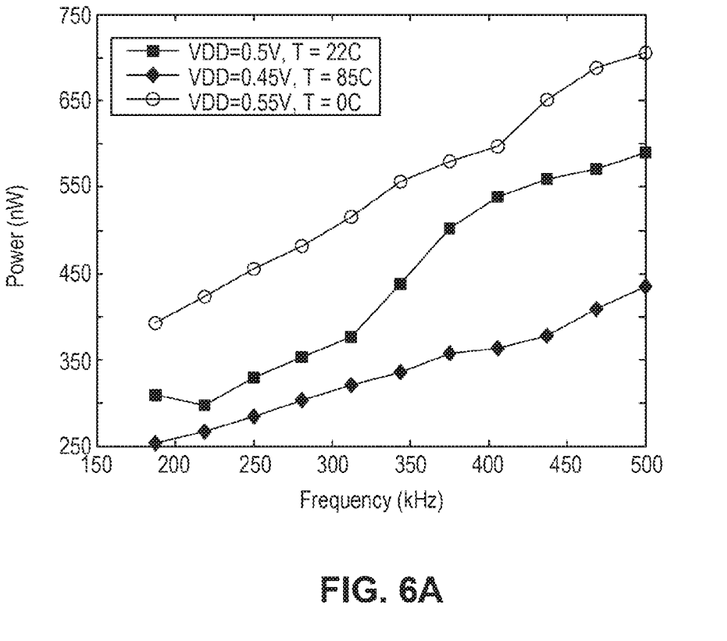
FIGS. 6A-6D are graphs illustrating power consumption and jitter over the entire frequency range of the programmable clock generator.
Figure 6B:
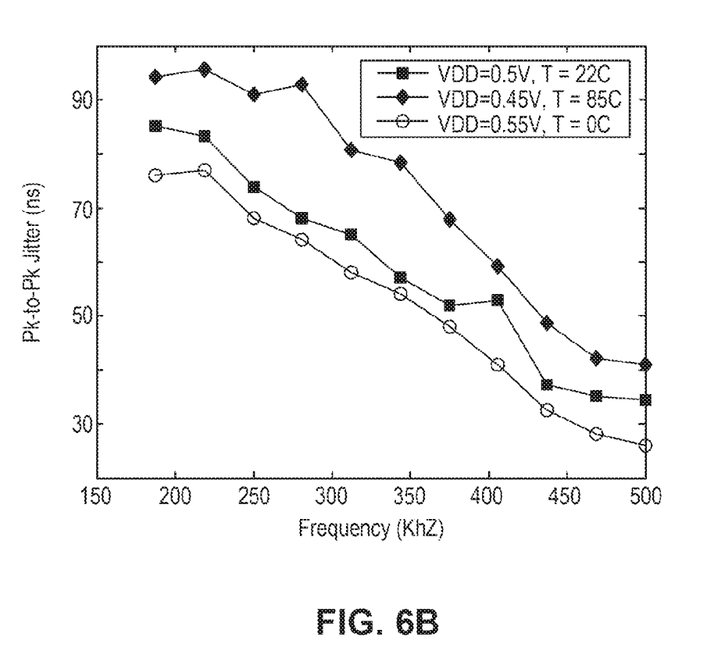
Figure 6C:
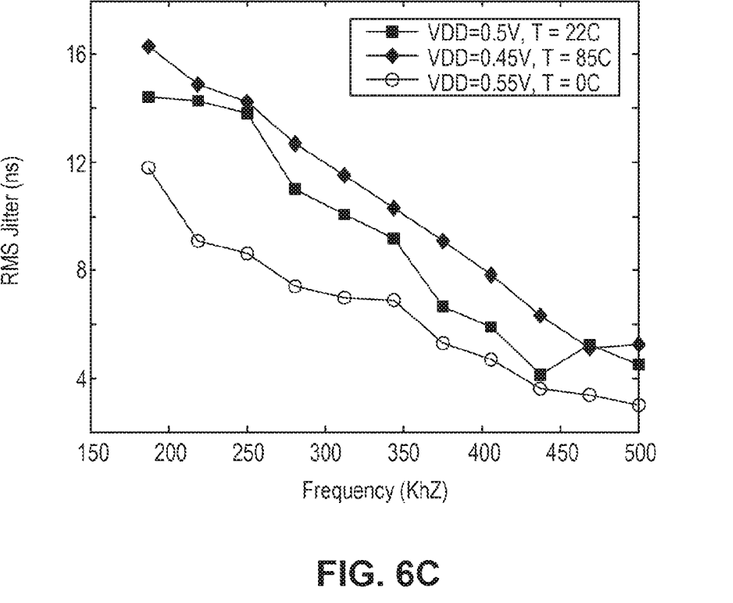
Figure 6D:
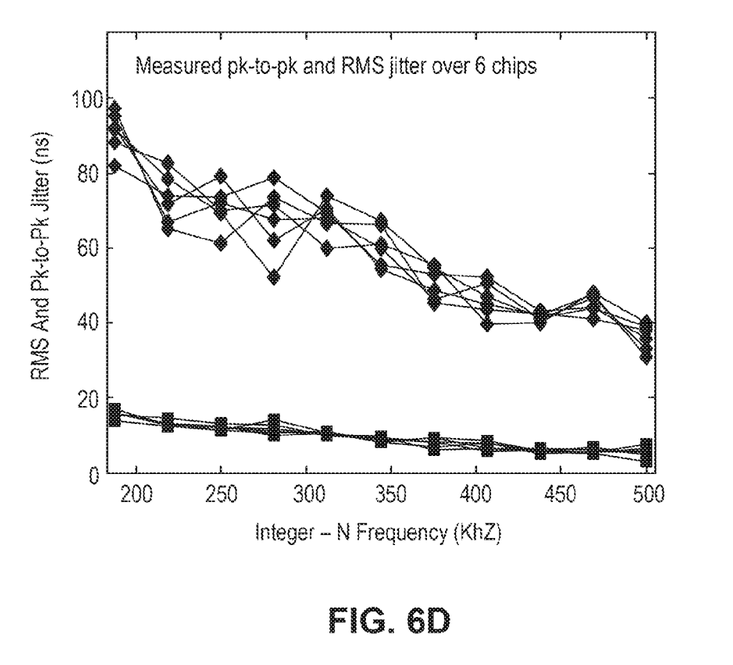
Figure 7:
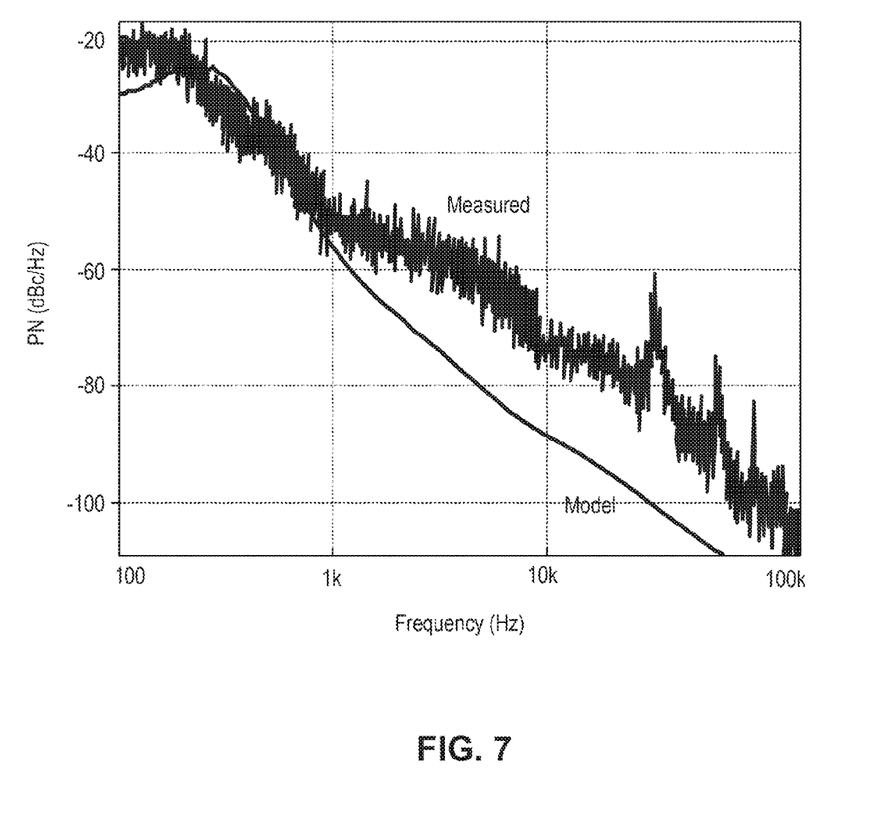
FIG. 7 is a graph illustrating the simulated and measured phase noise for the programmable clock generator.

In addition to enabling one of the two loops, the loop selector circuit 23 also passes along the error signal from selected loop to the DCO controller 25. The DCO controller 25 converts the error signal to a control signal for the digitally controlled oscillator 24, where the frequency of the output signal generated by the oscillator 24 is set in accordance with the control signal. The DCO controller 25 determines which of the switchable inverters 52 and/or which of the switches 54 should be opened or closed from the difference indicated in the error signal, thereby driving the output frequency towards the desired frequency. In the example embodiment, the clock generator 10 has a programmable range of 187 k Hertz to 500 k Hertz. Although not a linear relationship, opening and closing each switchable inverter 52 adjusts the output frequency on average by 18 k Hertz within the programmable range while opening and closing a subset of switches in a switch-cap cell make adjustments less than 1000 Hertz to the output frequency.

PVT variations are magnified in near or sub-$V_{th}$ operation. Large PVT variations require an oscillator with large tuning range in order to ensure lock, but large tuning range results in high power consumption. Therefore, it's desirable to reduce the impact of PVT variations on the DCO to reduce the required DCO tuning range. Zero-$V_{th}$ or dynamic $V_{th}$ (connecting the body to the gate) transistors are options to reduce the impact of PVT, but these solutions are either high leakage or not amenable to digital design flows. PVT variations mainly impact the overdrive voltage ($V_{ov}=V_{GS}-V_{th}$), and therefore the drive strength of the delay cells in a ring oscillator. Table 1 below lists $V_{ov}^2$ in two extreme operating corners (slow-slow, 0.45V, 85° C. and fast-fast, 0.55V, −40° C.).

| Parameter | @ minL | | @ L = 12 µm | |
|---|---|---|---|---|
| | Slow | Fast | Slow | Fast |
| $V_{ov}^2 = (V_{GS} - V_{th})^2$ | 0.0036 | 0.0729 | 0.1369 | 0.2421 |
| $V_{ov}^2$ Ratio | 20.25 | | 1.8 | |

Figure 3A:
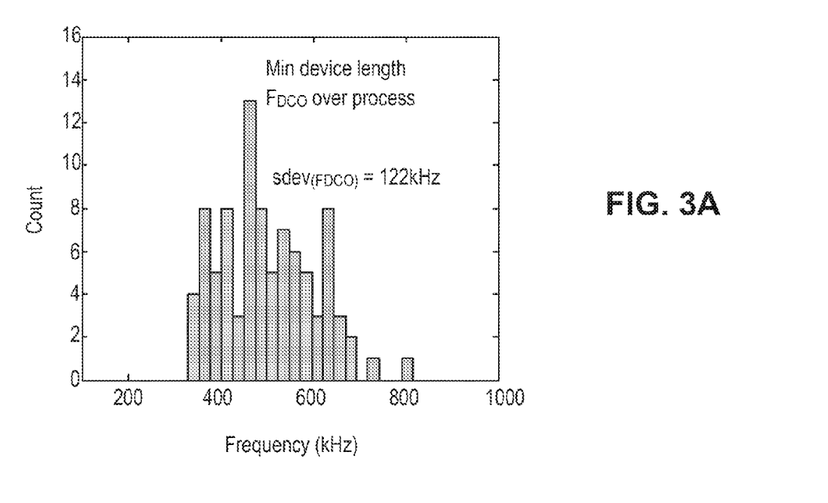
FIGS. 3A and 3B are graphs illustrating the frequency distribution for two different digitally controlled oscillators.
Figure 3B:
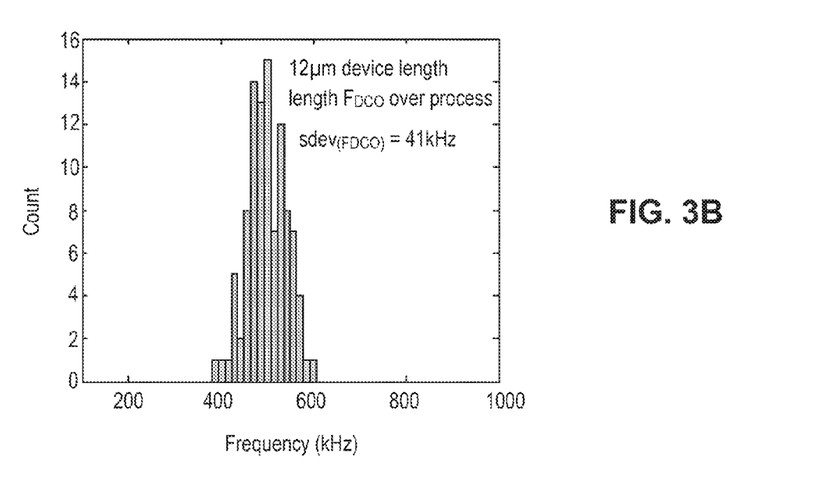

As shown, $V_{ov}^2$ is 20 times larger in the fast corner than in the slow corner for a minimum length device. However, $V_{th}$ decreases as the channel length is increased, and the table shows $V_{ov}^2$ only increases by 1.8× between the same corners for 12 µm length devices. FIGS. 3A and 3B compare the frequency distribution over process for two different near-Vth 500 kHz DCOs. The frequency spread over process for a DCO with minimum sized inverters is three (3) times as large as that of a 12 µm inverter-based DCO. This means that the DCO tuning range to calibrate out the PVT variations can shrink by roughly 3× by using long-channel devices, resulting in power savings by roughly the same factor. Using long channels to reduce PVT impact is also amenable to a digital design flow, synthesis, and APR. Accordingly, in some embodiments, the digitally controlled oscillator 24 as well as other circuits of the programmable clock generator are implemented with transistors having long channels, i.e., on the order of 12 µm or ten times the minimum length for CMOS technology. These values may differ for other types of process technologies which are also contemplated by this disclosure.

The programmable clock generator 10 was tested to verify the correct functionality and performance. Aside from the ability to generate correct clock frequencies, the jitter performance of the programmable clock generator 10 was tested extensively. FIG. 5 shows the power consumption, peak-to-peak jitter and RMS jitter over the entire frequency range (N=6 to N=16). The programmable clock generator 10 was designed to have RMS jitter <25 ns in the entire frequency range. As can be seen from FIG. 5, the worst case RMS jitter is 14 ns in the nominal corner.

Due to the low-voltage design, the PVT variations are typically exacerbated. Six different chips were tested to observe any process variations and to verify that the programmable clock generator meets the designed specifications. Results are shown in FIG. 5.

Additionally, power and jitter were also measured at extreme temperature (0° C. and 85° C.) and VDD (0.45V and 0.55V) corners. The power consumption for the entire operating range is below 700 nW, which scales with frequency from 300 nW to 600 nW under nominal operating conditions.

It is worth noting here that the jitter measurements are those of the entire programmable clock generator system (crystal+PLL) and the RMS jitter at the lowest frequency is 0.025%. FIG. 6 shows the simulated and measured phase noise at N=11 (343 kHz) for the ADPLL. The phase noise matches the model well in-band, but not in far out out-of-band-frequencies.

The foregoing description of the embodiments has been provided for purposes of illustration and description. It is not intended to be exhaustive or to limit the disclosure. Individual elements or features of a particular embodiment are generally not limited to that particular embodiment, but, where applicable, are interchangeable and can be used in a selected embodiment, even if not specifically shown or described. The same may also be varied in many ways. Such variations are not to be regarded as a departure from the disclosure, and all such modifications are intended to be included within the scope of the disclosure.

Example embodiments are provided so that this disclosure will be thorough, and will fully convey the scope to those who are skilled in the art. Numerous specific details are set forth such as examples of specific components, devices, and methods, to provide a thorough understanding of embodiments of the present disclosure. It will be apparent to those skilled in the art that specific details need not be employed, that example embodiments may be embodied in many different forms and that neither should be construed to limit the scope of the disclosure. In some example embodiments, well-known processes, well-known device structures, and well-known technologies are not described in detail.

What is claimed is:

1. A programmable clock generator, comprising:
   an oscillator circuit configured to receive a control signal and generate an output signal oscillating at a frequency, where the frequency of the output signal is set in accordance with the control signal;
   a frequency-locked loop circuit configured to receive a desired output frequency and the output signal from oscillator circuit, wherein the frequency-locked loop circuit oversamples the output signal from the oscillator circuit and determines the frequency of the output signal from the oversampled signal and generates an error signal without the use of a frequency divider, where the error signal indicates a difference between the desired output frequency and the determined output frequency;

a phase-locked loop circuit configured to receive a reference signal and the output signal from oscillator circuit, wherein the phase-locked loop circuit determines a phase error between the reference signal and the output signal without the use of a frequency divider and generates an error signal from the phase error, where the error signal indicates a difference between the desired output frequency and the determined output frequency;

a loop selector circuit configured to receive the error signal from the frequency-locked loop circuit and the error signal from the phase-locked loop circuit, wherein the loop selector circuit selects one of the error signals and outputs the selected error signal; and a controller configured to receive the selected error signal from the loop selector circuit and converts the error signal to the control signal for the oscillator circuit.

2. The programmable clock generator of claim 1 wherein the oscillator circuit is implemented by a ring oscillator.

3. The programmable clock generator of claim 1 wherein the oscillator circuit is implemented with CMOS transistors, each transistor having a channel length ten times the minimum length for CMOS technology.

4. The programmable clock generator of claim 3 wherein the frequency-locked loop circuit includes an edge combiner circuit.

5. The programmable clock generator of claim 1 wherein the phase-locked loop circuit generates the error signal by taking a derivative of the phase error.

6. The programmable clock generator of claim 5 wherein the loop selector circuit enables the frequency-locked loop circuit and disables the phase-locked loop circuit when the difference indicated by the error signal received from the phase-locked loop circuit is greater than the threshold.

7. The programmable clock generator of claim 1 wherein the phase-locked loop circuit includes a time-to-digital converter circuit.

8. The programmable clock generator of claim 1 wherein the loop selector circuit enables the phase-locked loop circuit and disables the frequency-locked loop circuit when the difference indicated by the error signal received from the frequency-locked loop circuit is less than a threshold.

9. The programmable clock generator of claim 1 is implemented by transistors operating in or near subthreshold region.

10. A programmable clock generator, comprising:
an oscillator circuit configured to receive a control signal and generate an output signal oscillating at a frequency, where the frequency of the output signal is set in accordance with the control signal;

a frequency-locked loop circuit configured to receive a desired output frequency and the output signal from oscillator circuit, wherein the frequency-locked loop circuit determines frequency of the output signal and generates an error signal, where the error signal indicates a difference between the desired output frequency and the determined output frequency;

a phase-locked loop circuit configured to receive a reference signal and the output signal from oscillator circuit, wherein the phase-locked loop circuit determines a phase error between the reference signal and the output signal and generates an error signal from the phase error, where the error signal indicates a difference between the desired output frequency and the determined output frequency;

a loop selector circuit configured to receive the error signal from the frequency-locked loop circuit and the error signal from the phase-locked loop circuit, select one of the error signals and output the selected error signal, wherein the loop selector circuit enables the phase-locked loop circuit when the difference indicated by the error signal received from the frequency-locked loop circuit is less than a threshold and enables the frequency-locked loop circuit when the difference indicated by the error signal received from the phase-locked loop circuit is greater than the threshold; and a controller configured to receive the selected error signal from the loop selector circuit and converts the error signal to the control signal for the oscillator circuit.

11. The programmable clock generator of claim 10 wherein the oscillator circuit is implemented by a ring oscillator.

12. The programmable clock generator of claim 10 wherein the oscillator circuit is implemented with CMOS transistors, each transistor having a channel length ten times the minimum length for CMOS technology.

13. The programmable clock generator of claim 10 wherein the frequency-locked loop circuit oversamples the output signal from the oscillator circuit and determines the frequency of the output signal from the oversampled signal.

14. The programmable clock generator of claim 10 wherein the phase-locked loop circuit generates the error signal by taking a derivative of the phase error.

15. The programmable clock generator of claim 10 wherein the phase-locked loop circuit includes a time-to-digital converter circuit.

16. The programmable clock generator of claim 10 wherein the loop selector circuit disables the frequency-locked loop circuit when the difference indicated by the error signal received from the frequency-locked loop circuit is less than a threshold and disables the phase-locked loop circuit when the difference indicated by the error signal received from the phase-locked loop circuit is greater than the threshold.

17. The programmable clock generator of claim 10 is implemented by transistors operating in or near subthreshold region.

* * * * *